United States Patent [19]
Chi et al.

[11] Patent Number: 5,714,791
[45] Date of Patent: Feb. 3, 1998

[54] ON-CHIP PELTIER COOLING DEVICES ON A MICROMACHINED MEMBRANE STRUCTURE

[75] Inventors: Cheng-Chung John Chi, Taipei, Taiwan; Rudolf Peter Huebener, Tuebingen, Germany; Chang Chyi Tsuei, Chappaqua, N.Y.

[73] Assignee: International Business Machines Corporation, Armonk, N.Y.

[21] Appl. No.: 671,477

[22] Filed: Jun. 27, 1996

Related U.S. Application Data

[60] Provisional application No. 60/009,181 Dec. 22, 1995.

[51] Int. Cl.$^6$ .............................. H01L 27/16; H01L 35/28
[52] U.S. Cl. ........................... 257/467; 257/930; 257/468; 257/419
[58] Field of Search .............................. 257/930, 419, 257/467, 468

[56] References Cited

U.S. PATENT DOCUMENTS

| | | |
|---|---|---|
| 4,929,282 | 5/1990 | Brun et al. |
| 5,059,543 | 10/1991 | Wise et al. ............... 257/930 |
| 5,162,298 | 11/1992 | Chaudhari et al. |
| 5,448,109 | 9/1995 | Cauchy. |
| 5,449,952 | 9/1995 | Kataoka et al. ............... 257/930 |
| 5,515,238 | 5/1996 | Fritz et al. ............... 257/930 |

FOREIGN PATENT DOCUMENTS

| 142185 | 2/1989 | Japan ................... 257/930 |
|---|---|---|

OTHER PUBLICATIONS

R. Haakenaasen et al, Appl. Phys. Lett. 64 (12), 21 Mar. 1994, entitled "High quality crystalline $YBa_2Cu_3O_{7-\beta}$ films on thin silicon substrates", pp. 1573–1575.

Y. Ogawa et al, Electronics and Communications in Japan, Part 2, vol. 76, No. 1, 1993, entitled "Some Considerations on Thermoelectric Cooling Device", pp. 68–79.

J.Z. Sun et al, Appl. Phys. Lett. (11), 13 Sep. 1993, entitled "Improved process for high-$T_c$ superconducting step-edge junctions", pp. 1561–1563.

R. Smythe, Electronic Products, Aug. 1995, entitled "Thermoelectric coolers take the heat out of today's hot chips", pp. 47–48.

*Primary Examiner*—Jerome Jackson
*Attorney, Agent, or Firm*—Stephen S.. Strunck

[57] ABSTRACT

This invention provides a Peltier cooling device generally useful in cooling electronic devices, especially those which are formed of high Tc superconducting materials. The Peltier device of the invention is formed on a micromachined membrane structure to assure good thermal isolation and to intimately integrate the cooling device with the electronic device it is to cool.

The membrane is formed by selective, controlled etching of a bulk substrate of a material such as silicon. The Peltier device is formed by selectively implanting or depositing appropriate dopants to form n-doped and p-doped segments on the membrane with a junction between the differently doped segments at the approximate mid-point of the membrane.

25 Claims, 4 Drawing Sheets

5,714,791

ON-CHIP PELTIER COOLING DEVICES ON A MICROMACHINED MEMBRANE STRUCTURE

This application is a continuation of provisional application Ser. No. 60/009,181 filed Dec. 22, 1995, now abandoned.

BACKGROUND OF THE INVENTION

The present invention pertains generally to Peltier-effect thermoelectric effect coolers and more particularly to such coolers integrated on micromachined membrane structures.

In 1821 T. J. Seebeck discovered that an electric current will be present in a series loop of two different metals provided that the junctions are at different temperatures. This effect is the basis for temperature measurement with the use of thermocouples. In 1834 J. Peltier discovered that if a current were circulated through the same series loop, one junction would be heated and heat would be absorbed at the other. If the current was reversed in the loop, the heated and heat absorbing junctions reversed. Peltier devices today are used in many applications ranging from refrigerators to cooling devices for microelectronic equipment. Such modern devices may be composed of segments of heavily doped semiconductors which are connected electrically in series and thermally in parallel between the heated and cooled surfaces of the device. Such semiconductors are described, for example, in U.S. Pat. No. 4,929,282 to Brun et al. and in U.S. Pat. No. 5,448,109 to Cauchy, both of which are incorporated herein by reference.

Recent success in the fabrication of high-Tc Hg-based cuprate films, grain boundary junctions and Superconducting Quantum Interference Devices (SQUIDs) has opened the door to the use of superconducting electronics (e.g., SQUIDs, microwave devices, and infrared sensors) at unprecedently high temperatures (i.e., T≧112° K.). With the advent of superconducting devices operating at such high temperatures, it would be desirable to have a viable integrated circuit technology for on-chip cooling of such devices using the Peltier effect.

SUMMARY OF THE INVENTION

This invention provides a Peltier cooling device generally useful in cooling electronic devices, especially those which are formed of high Tc superconducting materials. The Peltier device of the invention is formed on a micromachined membrane structure to assure good thermal isolation and to intimately integrate the cooling device with the electronic device it is to cool.

The membrane is formed by selective, controlled etching of a bulk substrate of a material such as silicon. The Peltier device is formed by selectively implanting or depositing appropriate dopants to form n- and p-doped segments on the membrane with a junction between the differently doped segments at the approximate mid-point of the membrane.

BRIEF DESCRIPTION OF THE DRAWINGS

The features and advantages of the present invention will be apparent from the following description taken in connection with the accompanying drawings, wherein.

DETAILED DESCRIPTION OF THE INVENTION

The on-chip Peltier cooler of the present invention eliminates the inconvenience and hinderance to many superconducting electronics applications brought about by the use of conventional cryocoolers or coolants such as liquid helium or nitrogen. Other advantages of the Peltier cooler of the invention include miniturization; local, selective cooling; absence of mechanical noise; and absence of moving parts. Conventional Peltier devices are extremely poor in efficiency compared with the integrated cooler of the invention. The maximum temperature difference (between the cooled temperature and room temperature) demonstrated by such prior art cooling devices is typically only of the order of several tens of degrees. As a consequence, the prior art devices are limited in their applications, typically to stabilizing operating temperatures of such devices as gaussmeters and semiconductor lasers.

Figure 1A:
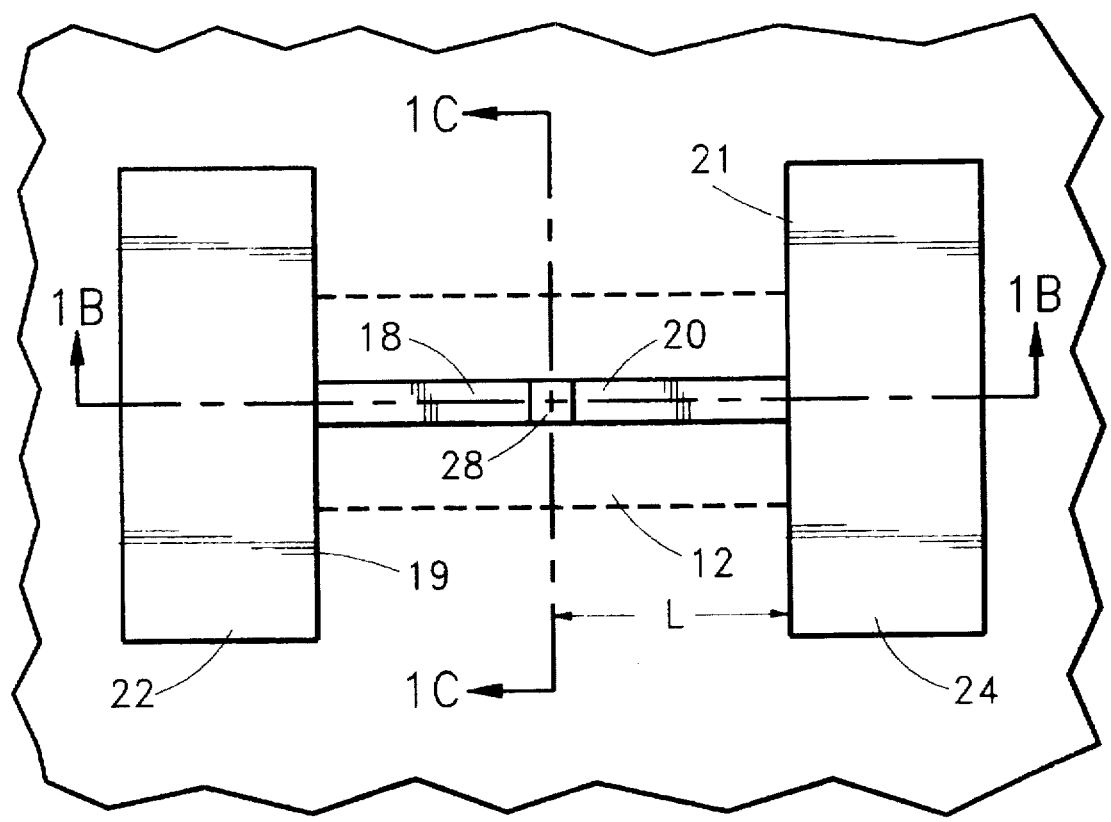
FIG. 1A is a schematic top view of the Peltier device of the present invention situated on a membrane micromachined in a silicon wafer.
Figure 1B:
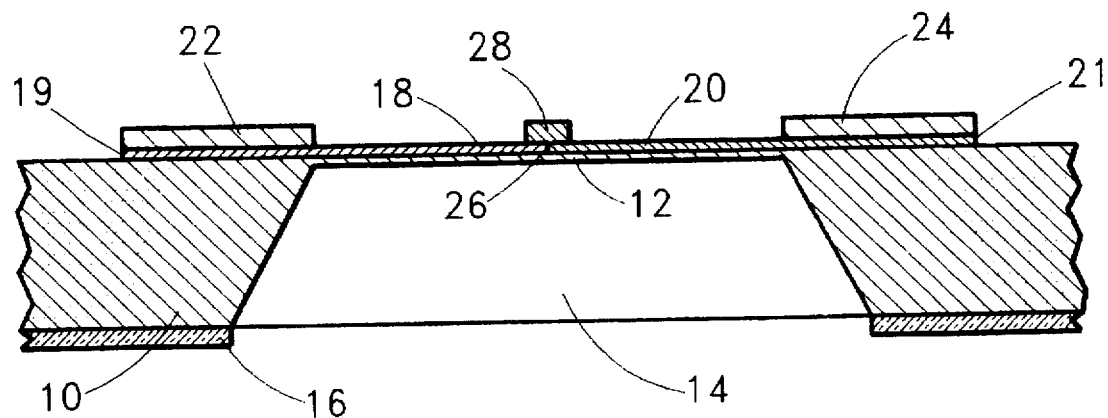
FIG. 1B is a cross-sectional view of the structure of FIG. 1A taken along line B—B.
Figure 1C:
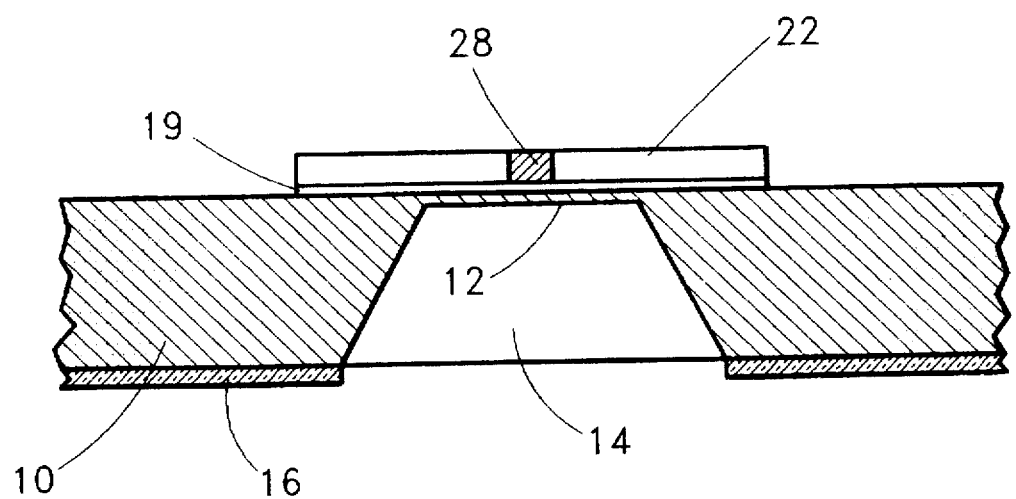
FIG. 1C is a cross-sectional view of the structure of FIG. 1A taken along line C—C.

The salient features of the Peltier device of the present invention are shown in FIG. 1A (top view), FIG. 1B (cross-section along B—B) and FIG. 1C (section along C—C). In these Figures, there is shown silicon wafer (or substrate) 10 with membrane 12. The thickness of wafer 10 is typically in the range of from about 200 μm to about 500 μm, although this is not critical to the invention. Aperture 14 lies beneath silicon membrane 12 and in this embodiment appears as a rectangle in FIG. 1A denoted in part by the dashed lines shown in FIG. 1A.

Membrane 12 and aperture 14 may be formed by subtractive etching from one major (bottom or first) surface of the wafer. The etch is terminated at the desired membrane thickness by thermally diffusing or implanting a dopant into the other major (top or second) surface of the silicon wafer to the depth desired for the thickness of membrane 12 (typically 1–2 um). Such procedures are described in the paper by Haakenaasen et al. in Appl. Phys. Lett., 64 (12), pp. 1273–75 (21 Mar. 1994) which is herein incorporated by reference.

The shape of membrane 12 is controlled by openings in an oxide layer 16 (e.g., SiO$_2$) on the first side. Such oxide may be thermally grown as is known in the semiconductor arts and removed in the area where etching is to occur by removal methods commonly practiced in the semiconductor arts. Thus the shape of aperture 14 will be determined by the opening in layer 16 through which etching occurs and the crystallographic orientation of the wafer. Certainly, rectangles, squares and circles are readily obtainable. While the wafer material illustrated in this embodiment is silicon, other suitable substrates may be employed (e.g., Si$_3$N$_3$).

Linear Peltier segments 18 and 20 (typically 1 mm wide by 10 mm long) run parallel to the long dimension of silicon membrane 12 in FIG. 1A. A preferred way to prepare those segments is to selectively expose, through a suitable masking material, first areas corresponding to segment 18 on membrane 12 and defined region 19 on substrate 10 adjacent to and contiguous with segment 18. Thereafter, an n- or p-doped high Seebeck coefficient material, such as PbTe, is deposited as by plasma vapor deposition (PVD), sputtering or chemical vapor deposition (CVD) or other such process onto segment 18 and region 19. Alternatively, the elements of the material may be deposited sequentially and thermally diffused to form the alloy. Subsequently, regions 18 and 19 are shielded, regions 20 and 21 are exposed and oppositely doped material is deposited. Alternatively, another on-chip Peltier structure may be formed by implanting, as by ion beam means, n- and p-type dopants into the silicon of areas 18, 19 and 20, 21 respectively.

Subsequently, electrical contact pads 22, 24 are formed above segments 19 and 21, respectively. First ends of segments 18 and 20 meet in the approximate center of membrane 12 forming junction 26. Above junction 26 is junction pad 28. Pad 28 minimizes p-n junction effects (e.g., rectification) and Joule heating at junction 26. Pads 22, 24, and 28 may be thin films deposited by, for example, sputtering through openings in photoresist layers. In operation, current is applied to either pad 22 or 24 (depending upon the nature of segments 18 and 20) and flowed through segments 18 and 20 to the opposite pad. Cooling will take place at junction 26 and the regions nearby and heat will flow away from junction 26 along segments 18 and 20 to pads 22 and 24, respectively.

While the previously described embodiment is preferred from a structural standpoint, there is a thermal efficiency penalty paid due to the doped silicon membrane 12 surrounding segments 18 and 20. In an embodiment preferred from thermal considerations, aperture 14 is etched through the thickness of wafer 10 except for the area of membrane 12 which will subsequently be deposited or doped to form segments 18 and 20. This is performed by selectively implanting the etch restricting doped layer on the second surface using photolithographic techniques such that the etching solution will etch away all of the substrate in the area of what is membrane 12 in FIG. 1A except for the areas which will be segments 18 and 20. Thus, segments 18 and 20 will bridge the gap in what was membrane 12 in the previously described embodiment.

Devices, such as a SQUID may be formed on membrane 12 at the side opposite pad 28. Alternatively, the device may be fabricated on segments 18, 20 in close proximity to pad 28. This may be done, for example, using device fabrication methods known in the semiconductor arts as described, for example, in the paper by Haakenaasen et al., in U.S. Pat. No. 5,162,298 to Chaudhari et al. and in the paper by Sun et al. in Appl. Phys. Lett. 59 (20), pp. 2609–11 (11 Nov. 1991) which patent and papers are herein incorporated by reference. Alternatively, devices may be attached to the cooled area by other means such as by the use of a thermally conductive, electrically insulating paste.

Figure 2:
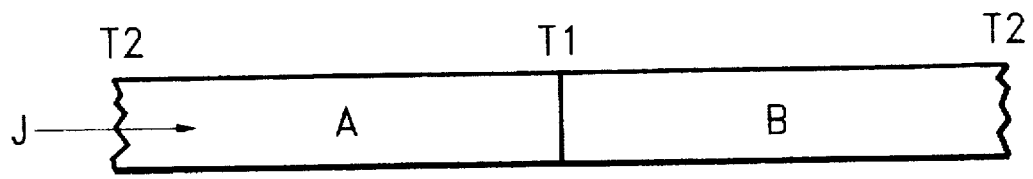
FIG. 2 is a schematic junction between two materials.

The cooling capability of the Peltier device of the invention may be shown with reference to the Peltier circuit shown schematically in FIG. 2. An electric current of density j carries a heat current of density $U_\pi$ given by $$U_\pi = \pi \cdot j = S \cdot T \cdot j$$

where $\pi$=Peltier coefficient

S=Seebeck coefficient,

T=temperature with the relation $\pi = S \cdot T$

At the junction between two conductors A and B the Peltier heat current density $U_\pi^{AB} = (\pi_A - \pi_B) \cdot j = \Delta \pi \cdot j$ is delivered. Again, we have $\Delta \pi = (S_A - S_b) \cdot T = \Delta S \cdot T$.

$U_\pi^{AB}$ changes sign upon reversal of the electric current. It is assumed that the current is directed such that the junction will be cooled. (As a consequence, heating occurs at the outer connections). The temperature of the junction is denoted $T_1$ and that of the outer connections $T_2$, with $T_1 < T_2$. In the following it is assumed that at the outer connections the temperature is kept fixed at room temperture by proper geometric means (thermal mass, cooling fins, etc.). The junction is thermally isolated (vacuum) except for the Si membrane sections providing the mechanical support and the electrical connections to the outside. The temperature difference $T_2 - T_1$ results in a heat current density $U_\kappa$ from both directions towards the cold junction, given by $$U_\kappa = 2 \cdot \kappa \cdot \frac{T_2 - T_1}{L}$$

where $\kappa$=heat conductivity

L=distance between junction and outer connection

It is initially assumed that $\kappa$ is only weakly temperature dependent $$\left( \nabla T = -\frac{T_2 - T_1}{L} \right).$$

The factor 2 results from heat flow in two opposite directions away from the junction. Joule heating, which can be shown to be small in relation to Peltier Power and heating due to contact resistance, is neglected.

In the stationary state, $$U_\pi^{AB} - \frac{1}{\rho} E^2 \cdot L = 2\kappa \frac{T_2 - T_1}{L} \quad (1)$$

and $$\Delta S \cdot T \cdot \frac{E}{\rho} - \frac{E^2}{\rho} \cdot L = 2\kappa \frac{T_2 - T_1}{L}$$

and $$\Delta T \equiv T_2 - T_1 = \frac{1}{2\kappa} \left[ \Delta S \cdot T \cdot \frac{E \cdot L}{\rho} - \frac{(E \cdot L)^2}{\rho} \right]$$

$$= \frac{1}{2\kappa\rho} [(\Delta S \cdot T) V - V^2]$$

where E=electric field, $V = E \cdot L$, S=Seebeck coefficent, $\rho$=resistivity, $\sigma$=electrical conductivity=$j/E = 1/\sigma$ and $\Delta S$=difference in S between the two Peltier elements.

($\Delta T$) max occurs when $V = \frac{1}{2}(\Delta S \cdot T)$, thus in bulk materials $$(\Delta T)_{max} \equiv (T_H - T_C) = \frac{1}{8\kappa\rho} (\Delta S \cdot T)^2 \quad (2)$$

If the Wiedemann-Franz law holds (assumes that the lattice thermal conduction can be neglected), which should be a close approximation for the case of a thin membrane, then:

$$\kappa = \sigma \frac{\pi^2}{3} \left( \frac{k_B}{e} \right)^2 T$$

where e=elementary charge and $$(\Delta T)_{max} = \frac{3}{8\pi^2} \frac{(\Delta S)^2}{(k_B/e)^2} T \quad (3)$$

If it is assumed that the temperature $T_H$ of the hot junction is 300 K, $\Delta S$=505 μV/K, $\kappa_B$=0.0179 W/cm·K, and $\rho = \frac{1}{870}$ Ω·cm for Pb-Te, then: $T_c$=210° K. for the n-doped and p-doped Pb-Te bulk case using Eqn (2) and $T_c=188°$ K. for the membrane Pb-Te case using Eqn (3).

Bulk type thermoelectric coolers, which utilize the Peltier principle and n- and p-type elements, such as those sold by Melcor of Trenton, N.J., are available commercially. Such bulk type coolers are described in the article by R. Smythe in the August 1995 issue of Electronic Products at p. 47, which is incorporated herein by reference. If a two-stage such cooler was used to pre-cool the substrate (e.g., silicon wafer 10) by placing the substrate in good thermal contact with the bulk cooler (precooler) so as to decrease $T_H$ to 210° K., then $T_c$ realized by the thin film device of this invention would be about 132° K. For a three-stage such device used as a precooler, $T_H \cong 200°$ K. and $T_c \cong 120°$ K. Similar results are obtained when n-doped and p-doped silicon are used as the Peltier elements.

As a figure of merit, the coefficient of performance, $\eta$, is defined as the ratio of Peltier power to Joule heat power:

$$\eta = \frac{P_{peltier}}{P_{Joule}} = \frac{\Delta S \cdot T}{E \cdot L} = \frac{\Delta S \cdot T}{V}$$

For $(\Delta T)_{max}$ condition, $$(\eta)_{optimal} = \frac{\Delta S \cdot T}{1/2 \, (\Delta S) \, T} = 2$$

It may be possible to achieve $(\eta)_{optimal}$ greater than 2 (e.g., 3 to 5) by using improved materials such as those as described by Ogawa et al. in Electronics and Communications, in Japan, Part 2, vol. 76, No. 1, pp. 68–79, 1993.

Figure 3:
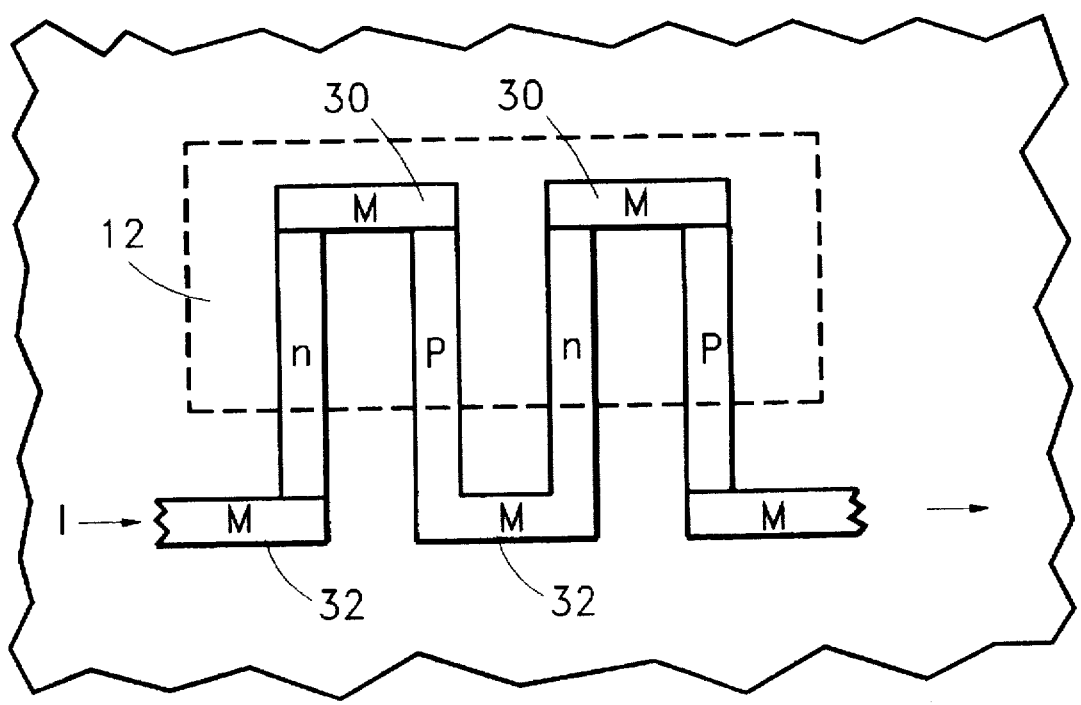
FIG. 3 is a schematic representation of a plurality of Peltier devices of the invention in series on a membrane.

In the event that more cooling capacity is required than can be obtained from a single device, the device of the invention may be formed of an alternating plurality of n-doped and p-doped segments in series on membrane 12 interconnected by metallic cold junctions 30 as is shown, for example, in FIG. 3. In FIG. 3, the cold junctions 30 are located in membrane region 12 and the hot junctions 32 over the thick part of the substrate.

Figure 4:
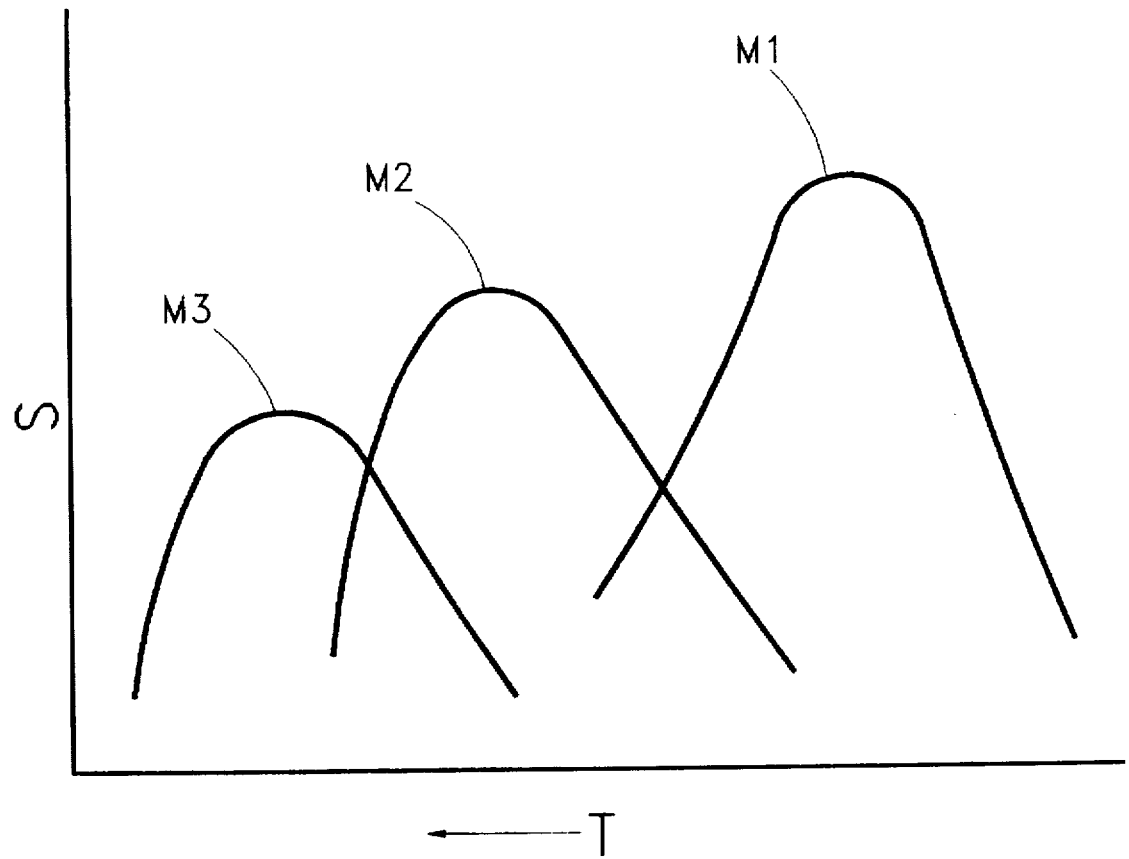
FIG. 4 is a graph of S vs. T for several materials having different Seebeck coefficients.

Further, $(\Delta T)_{max}$ depends on the thermoelectric power S of the Peltier elements. Since S is a function of temperature, the curve of S versus T peaks at different temperatures for different materials. Thus, in order to more effectively achieve the lowest cooling temperature a composite structure is proposed for segments 18, 20 using materials whose S vs. T profiles overlap as shown in FIG. 4. As may be seen from FIG. 4, not only do the profiles overlap, but they peak at progressively lower temperatures. To take advantage of this, in a layered structure, the material having the peak at the lowest temperature in the S vs. T curves should be closest to the device to be cooled and the material having the peak at the highest temperature should be farthest from the device to be cooled. Alternatively, the composite may be made by placing the materials side-by-side of each other.

Having thus described the preferred and other embodiments of the present invention, it will be understood that changes may be made in the size, shape and configuration of the parts described herein without departing from the present invention as recited in the claims.

Having thus described our invention what we claim as new and desire to secure as Letters Patent, is:

1. A Peltier device on a membrane structure comprising:
   a) a substrate having an aperture therein, said aperture terminating at a membrane region;
   b) p-doped and n-doped segments on said membrane region and p-doped and n-doped regions adjacent to and contiguous with said segments, first ends of said segments meeting at a common point on said membrane to form a junction;
   c) metal contact pads situated on top of said doped regions opposite said junction; and
   d) a junction pad situated above said junction.

2. The device of claim 1 wherein said substrate is silicon.

3. The device of claim 1 wherein said membrane is about 2 um in thickness.

4. The device of claim 1 wherein said segments are about 1 mm in width.

5. The device of claim 1 wherein said segments are a composite layered structure of different semiconductor materials having thermoelectric power versus temperature profiles which overlap and which peak at progressively lower temperatures.

6. The device of claim 5 wherein the materials are layered with the material having the highest peak temperature in the thermoelectric power versus temperature profile being placed farthest from the device to be cooled and the material having the lowest peak temperature in the thermoelectric power versus temperature profile being placed closest to the device to be cooled.

7. The device of claim 5 wherein said materials are placed side-by-side.

8. The device of claim 1 wherein said substrate is placed in contact with one or more stages of a bulk Peltier precooler.

9. A Peltier device comprising:
   a) a substrate having first and second surfaces and an aperture therethrough;
   b) a membrane structure located proximately at said second surface and spanning said aperture, said membrane being thin in comparison to the thickness of said substrate;
   c) said membrane having two segments of two different semiconductor types and having a junction between said two segments at the approximate midpoint between said segments; and
   d) thin film metal contact pads for contacting said segments at their ends opposite said junction.

10. The device of claim 9 wherein said substrate is silicon.

11. The device of claim 9 wherein said membrane is about 2 um in thickness.

12. The device of claim 9 wherein said segments and said membrane are about 1 mm in width.

13. The device of claim 9 wherein said segments are a composite layered structure of different semiconductor materials having thermoelectric power versus temperature profiles which overlap and which peak at progressively lower temperatures.

14. The device of claim 13 wherein the materials are layered with the material having the highest peak temperature in the thermoelectric power versus temperature profile being placed farthest from the device to be cooled and the material having the lowest peak temperature in the thermoelectric power versus temperature profile being placed closest to the device to be cooled.

15. The device of claim 13 wherein said materials are placed side-by-side.

16. The device of claim 9 wherein said substrate is placed in contact with one or more stages of a bulk Peltier precooler.

17. A Peltier device on a membrane structure comprising:
   a) a substrate having an aperture therein, said aperture terminating at a membrane region;
   b) p-doped and n-doped segments implanted in said membrane region and p-doped and n-doped regions implanted in said substrate adjacent to and contiguous with said segments, first ends of said segments meeting at a common point on said membrane to form a junction;

c) metal contact pads situated on top of said doped regions opposite said junction; and d) a junction pad situated above said junction.

18. The device of claim 17 wherein said substrate is silicon.

19. The device of claim 17 wherein said membrane is about 2 um in thickness.

20. The device of claim 17 wherein said segments are about 1 mm in width.

21. The device of claim 17 wherein said segments are a composite layered structure of different semiconductor materials having thermoelectric power versus temperature profiles which overlap and which peak at progressively lower temperatures.

22. The device of claim 21 wherein the materials are layered with the material having the highest peak temperature in the thermoelectric power versus temperature profile being placed farthest from the device to be cooled and the material having the lowest peak temperature in the thermoelectric power versus temperature profile being placed closest to the device to be cooled.

23. The device of claim 21 wherein said materials are placed side-by-side.

24. The device of claim 17 wherein said substrate is placed in contact with one or more stages of a bulk Peltier precooler.

25. The device of claim 17 wherein an alternating plurality of n-doped and p-doped segments are placed in series on said membrane interconnected by metallic cold junctions.

* * * * *